Nov. 4, 1969
W. R. HAWKINS
3,477,030

DIRECT COUPLED TRANSISTOR AMPLIFIER EMPLOYING RESISTIVE FEEDBACK AND COMMON BIASING MEANS

Filed Oct. 19, 1965

INVENTOR.
WILLIAM R. HAWKINS
BY
Flam and Flam
ATTORNEYS.

United States Patent Office 3,477,030
Patented Nov. 4, 1969

3,477,030

DIRECT COUPLED TRANSISTOR AMPLIFIER EMPLOYING RESISTIVE FEEDBACK AND COMMON BIASING MEANS

William R. Hawkins, Van Nuys, Calif., assignor to Newcomb Electronics Corp., Los Angeles, Calif., a corporation of California Filed Oct. 19, 1965, Ser. No. 497,697
Int. Cl. H03f 3/42
U.S. Cl. 330—19 6 Claims

ABSTRACT OF THE DISCLOSURE

A direct-coupled amplifier comprising two transistors of the same type, the emitter of the first transistor being directly connected to the base of the second transistor and connected via a resistor to the emitter of the second transistor. A second resistor connects the emitter of the second transistor to the ground terminal of a source of operating potential. A resistor directly connected between the collector of the second transistor and the base of the first transistor provides degenerative feedback and, in conjunction with the two emitter resistors, functions to provide both DC and AC gain stabilization for the amplifier.

BRIEF SUMMARY OF THE INVENTION

This invention relates to transistor amplifiers, and more particularly to a novel and improved direct-coupled amplifier employing two transistor stages, having greater operating stability than prior circuits intended for generally similar application, and also having greater immunity to adverse variations in the characteristics of individual transistors.

There has been developed, heretofore, a number of direct-coupled transistor amplifiers, the well-known Darlington circuit being representative of such devices. Such prior circuits have, however, necessitated more-or-less elaborate means for stabilization of their operation in the presence of adverse environmental conditions. Furthermore, prior circuits have, for the most part, required careful selection of the individual transistors used in the circuit in order to obtain satisfactory performance. The novel and improved amplifier of the present invention overcomes these shortcomings of prior circuits and also provides a number of additional advantages, as will become apparent from the following specification.

Basically, the amplifier of the present invention comprises a pair of direct-coupled, cascaded, transistor stages having a novel interstage network which functions both to provide negative feedback for AC gain stability and to provide a DC bias for DC gain stability. This novel interstage network also compensates for ambient temperature changes. Other features of the circuit include a high input impedance, a medium-to-low output impedance, and a high degree of immunity to differences in the beta characteristics (HFE) of the individual transistors.

It is therefore a principal object of the present invention to provide a novel and improved transistorized amplifier which does not require close matching of the beta characteristics of the transistors employed in the cascaded stages.

Still another object of the present invention is to provide a novel and improved transistorized amplifier having a high input impedance, high gain, and a medium-to-low output impedance.

Yet another object of the present invention is to provide a novel and improved direct coupled transistorized amplifier which is immune to adverse ambient temperature effect.

It is a general object of the present invention to provide a novel and improved direct-coupled transistorized amplifier which overcomes the shortcomings of prior circuits heretofore intended to accomplish generally similar purposes.

Figure 1:
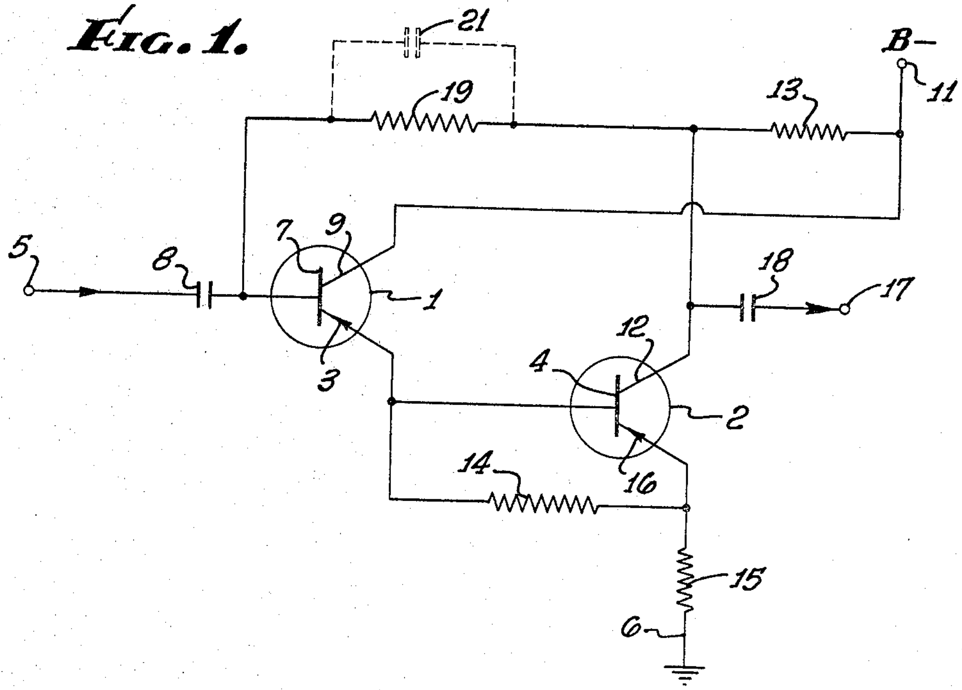
Figure 2:
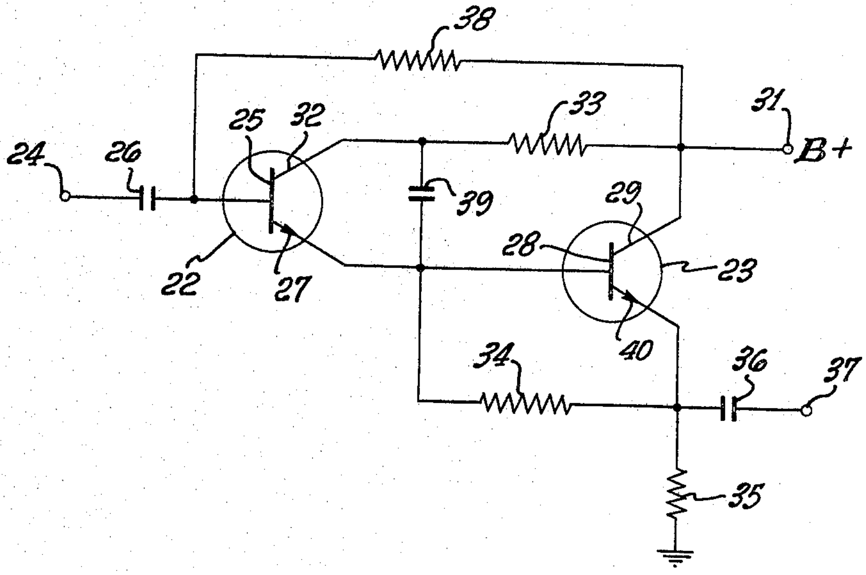

These and other objects of the invention will become more apparent upon consideration of the following specification, taken in conjunction with the drawings, in which:

FIGURE 1 is a schematic circuit diagram of a preferred embodiment of the invention; and FIG. 2 is a modification of the invention designed principally for use with silicon transistors.

DETAILED DESCRIPTION

Looking now at FIGURE 1, there is shown a preferred embodiment of the invention comprising two direct-coupled transistors 1 and 2 connected in an emitter-follower arrangement; that is, the emitter 3 of transistor 1 is directly coupled to the base 4 of transistor 2. In a preferred construction, transistors 1 and 2 comprise PNP type germanium transistors, each having a beta in the range from 50 to 500. The input signal is connected across input terminal 5 and ground 6. The input signal is applied to the base 7 of the transistor 1 via input coupling capacitor 8. Operating potential is applied directly to the collector 9 of transistor 1 via terminal 11. Similarly, operating potential is applied from terminal 11 to the collector 12 of transistor 2, via load resistor 13. Assuming the PNP type transistors are used, terminal 11 will be the negative terminal of the operating power supply. It will be obvious to those skilled in the art that the circuit may be modified to employ NPN type transistors, and such modification would involve a reversal of the polarity of the potential applied to terminal 11.

Emitter current from emitter 3 flows through both resistors 14 and 15, and emitter current from emitter 16 flows only through resistor 15 to ground 6. The output signal is taken preferably from collector 12 and appears at output terminal 17 via output coupling capacitor 18. It should be understood, however, that the output signal may optionally be taken from the junction between resistors 14 and 15.

Resistor 19 comprises a feed back resistor which performs two functions. Specifically, resistor 19 functions both as a feedback resistor for the AC signal voltage appearing at collector 12 and also provides a DC bias which appears at the base 7 of transistor 1. The voltage drop across resistors 14 and 15 biases the base 4 of transistor 2. This network arrangement interlocks the operating conditions of the two transistors and results in resistor 19 doubling both as the feedback resistor and also as the DC biasing resistor for the base 7 of transistor 1. In a typical construction, resistor 19 has a relatively high value and, for example, may be of the order of four to five megohms.

Resistor 14, which may, for example, be of the order of twelve thousand ohms, is sufficiently large to maintain a high input impedance if not degraded by the effect of a low impedance feedback circuit. The high resistance of resistor 19 will permit the signal applied to input terminal 5 to see a high input impedance, whereas in a conventional circuit, employing a feedback resistor of relatively low value, the input would appear to be the impedance seen through feedback resistor 19. That is, a low impedance feedback resistor would destroy the effectiveness of the high impedance of resistor 14 on the input.

Inasmuch as resistor 19 operates both as the DC bias resistor for base 7 and the AC signal feedback resistor, both DC and AC stability are obtained therefrom in combination with other circuit components. The effect of resistor 19 on the DC stability will be considered first.

Assume that transistor 2 begins to conduct an excessive amount of current as a result of some operating disturbance. This would result in a high current being drawn through resistor 15. The base 4 of transistor 2 is biased by the voltage drop across both resistor 14 and resistor 15. Thus, the bias appearing at the base 4, via resistor 14, would change the gain of transistor 2 and would also change the DC bias through resistor 19 to the base 7 of transistor 1. This method of providing DC stability operates much more satisfactorily than prior attempts to obtain stability by connecting the feedback resistor (e.g., resistor 19) or the base bias resistor (e.g., resistor 14) directly to ground.

Summarizing, the above assumed change in current conduction through transistor 2 would increase the voltage (in a positive direction) at collector 12, which increase would appear as an increase in the amount of current drawn through the load impedance, and therefore, appears as an increase in the voltage drop across resistor 13. In response to the stabilizing action, the voltage appearing at the collector 12 would fall and would in turn decrease current conduction through transistor 2. The effect of this action on transistor 1 would be greatly to reduce the emitter current at emitter 3 which maintains the bias on the base 4 of transistor 2 by reason of the voltage drop through resistor 14. This action evolves rapidly, causing the circuit to recover its initial stable operation.

As can be seen, this recovery operation overcomes the excessive current through resistor 14 and transistor 2 by means of the feedback path through resistor 14 and transistor 2 by means of the feedback path through resistor 19 to reduce conduction through transistor 1. Stated differently, this DC feedback arrangement helps transistor 1 have better control of the bias on base 4 of transistor 2 than could be attained if the two stages were not so interlocked.

The condition of excessive conduction through transistor 2 may result from an abnormally high ambient temperature. A condition of excessive leakage through transistor 2 which is higher than conduciton through the other transistor (1) may be due to different leakage characteristics. That is, the leakage through transistor 1 may be either more or less than the leakage through the transistor 2. Assuming a high ambient temperature which will increase the leakage current rate of transistor 1, such an increase in base leakage means that transistor 1 will not amplify this leakage by the amount proportional to the beta of the transistor. As a consequence, the additional increase in current will result in an increase in voltage drop across resistors 14 and 15, thereby increasing the bias on the base 4 of transistor 2 and such increase will be in the positive-going direction. This positive voltage increase will establish an adverse effect on the gain of transistor 2. This action will in turn produce an additional voltage drop through load resistor 13 and thus reduce the collector voltage at collector 12. The resulting reduction in effective operating potential is fed back through resistor 19 to the base 7 of transistor 1. The increase in negative voltage appearing at base 7 will effectively reduce the conduction of transistor 1. There will be an attendant sharp decrease in collector and emit ter current in transistor 1. Since transistor 1 is producing a voltage drop across resistors 14 and 15, this sudden change in voltage from a positive to a negative-going direction at the base of transistor 2. will similarly abruptly reduce conduction through transistor 2. At this point in time the base voltages typically will be five to six-tenths of a volt different than the emitter voltage in a positive direction, and one-tenth of a volt difference will make a considerable change in the ability of the transistor to cut off sharply.

Assuming that the values of resistors 14 and 15 are such that approximately two or three microamperes may make a change of one-tenth of a volt, there will be a very rapid control response, even though the action through one transistor is exactly opposite to the action desired to pick up the control and result in a decrease in conduction. The control action occurs in a stable manner due to the substantial amount of AC negative feedback to the unbiased base 7. While the gain through the entire amplifier, from terminal 5 to output terminal 17, in terms of voltage is not more than a factor of two or three, the curernt amplification through load resistor 13 may be of the order of 100. That is, the circuit depends on a large current change through resistor 13. However, since the base of transistor 1 is voltage sensitive, due to its high input impedance, the low current flowing into the base 7 will appear as a large current change at the collector 12 of transistor 2. It is this current change which comprises the output signal appearing at the output terminal 17. Inasmuch as the output circuit has an impedance of the order of 500 ohms or less, there is a substantial impedance change between the amplifier's input and output. This change is approximately 1 megohm upwards at the input, to 500 ohms downward at the output. In certain constructions of the invention, the output impedance may be made as low as 100 ohms or as high as 700 ohms.

The response of the amplifier to changes in ambient temperature will now be considered. Assuming that the temperature at transistor 2 is increased, the effect will be the same as if a larger voltage drop appeared across resistor 13, and there will be a corresponding reduction in collector current at transistor 2. The bias voltage applied to the base 7 of transistor 1 through feedback resistor 19 will, therefore, be reduced as previously explained, and transistor 1 may normally be operated without regard to changes in temperature at transistor 2. That is, an increase in temperature will tend to increase the current which will reduce the base bias at transistor 1 and decrease conduction therethrough. In the event that the second transistor begins to run away, the first transistor will limit its conduction by suitably changing the bias obtained via resistors 14 and 15. If transistor 1 begins to run away, then transistor 2 will control 1. As can be seen, a negative current feedback is applied from base to ground on one side of transistor 2 but a negative voltage feedback is applied from base to above ground through the collector side.

Summarizing, a high ambient temperature will tend to increase the leakage current of transistor 1, and thereby increase the voltage drop across resistors 14 and 15. This action increases the bias on base 4 of transistor 2 in a positive direction. The voltage drop across resistor 13 will therefore increase, and in turn reduce the voltage at the collector 12 of transistor 2. This action reduces the bias voltage applied through feedback resistor 19 to the base of transistor 1. This reduction in bias voltage similarly reduces the bias applied to the base 4 of transistor 2, by reason of the direct connection between transistor 1 and transistor 2.

An increase in temperature at transistor 2 will increase the leakage of transistor 2 and the resulting voltage drop across resistor 13 will increase. As a consequence, the collector voltage at transistor 2 will decrease and the bias applied to the base 7 of transistor 1, via resistor 19, will be reduced. This action in turn will reduce the bias at the base 4 of transistor 2 in the above-described manner, as a result of the direct connection between the two transistors. Thus, it can be seen that transistor 1 controls the bias of transistor 2, and transistor 2 controls the bias of transistor 1.

Considering now the AC gain stability of the circuit, feedback resistor 19 applies an AC feedback signal to the base 7 of transistor 1 in addition to the DC bias voltage therethrough. The AC gain (HFE) of transistor 2 controls the gain of transistor 2 in the same manner as the DC bias is controlled.

Considering now the input impedance, the values of resistors 19, 14 and 15 can be selected to give an input impedance that exceeds one megohm while maintaining all of the other above-described stabilization features of the circuit. This can be shown by the following relationship.

$$Z=\frac{R\cdot R'}{R+R'}$$

$$R=(B_2\cdot R_3)\cdot\left(B_2\left[\frac{B_2R_3R_2}{(B_2R_3+R_2}\right]\right)$$

where:

Z=input impedance $R_1$=resistance of resistor 19

$R_2$=resistance of resistor 14

$R_3$=resistance of resistor 15

$B_2$=beta of transistor 2.

Once the correct operating parameters have been established, the circuit will remain extremely stable with respect to the variations in the HFE of the transistor circuit, as well as for the wide variations in ambient temperature frequently encountered in practice. Further improvements in overall linearity may be had by application of AC feedback to the junction between resistors 14 and 15. The advantage obtained by AC stabilization is particularly important in minimizing the effects of variations in the beta of one transistor as compared with the other. More particularly, the beta of transistor 1 may, for example, be of the order of 100 while the beta of transistor 2 may be of the order of 300. Assuming the leakage current from base to-collector is multiplied by a beta of 100, as compared with a leakage current multiplied by a beta of 300 at the other transistor, there would result a significant change in circuit performance giving rise to a difficult problem of maintaining a high input impedance even by using an emitter-follower configuration. Heretofore this problem has been overcome by the addition of an extra transistor stage to provide the gain lost in the emitter-follower and in order to obtain an adequately high input impedance. In order to obtain a high input impedance in an emitter-follower it is necessary to use a very large emitter resistor. This greatly reduces the current flowing through the transistor and is frequently so low as to result in a situation wherein the leakage in the base circuit is almost exactly the same order to magnitude as the current flowing through the emitter circuit. Thus, any sudden change of temperatures will result in more current flowing in the base circuit than is desirable and the input impedance will drop quite rapidly, especially if the ambient temperature is relatively high. Stated in another way the emitter current being at a low value, any slight change in the leakage current will cause a major change in the gain of the circuit and in the input impedance. A leakage current would have less effect on the collector at a beta of 100 than at a beta because leakage between the base and the collector is amplied by the amount of gain of the transistor. This problem is characteristic of the previously mentioned Darlington circuit which uses very low emitter currents. The present circuit overcomes this problem and has the additional advantage of a high input impedance and a high-current gain at the output.

If desired, feedback resistor 19 may be modified to include a shunt capacitor 21 to alter the frequency response of the amplifier. Capacitor 21 will increase the amount of AC feedback in proportion to the frequency of the signal voltage, thus making the voltage feedback loop frequency responsive. This would result in a slight sacrifice in input impedance, depending upon the desired input frequency response curve. But, in any event, the operative impedance is maintained very low. That is, there is a hundred to one change in impedance from input to output, and in a typical construction, the input impedance may be of the order of one megohm and the output impedance may be of the order of one hundred ohms.

In a practical construction, the circuit is designed on the basis that the AC signal appearing across resistors 14 and 15 will be suitable for use with transistors having betas in the medium to low range. Such circuit design will provide a quiescent null at the base of transistor 2 in order to achieve the desired amount of gain. But, in the event that the gain of transistor 1 should increase to equal that of transistor 2, a larger signal will appear across resistors 14 and 15 than was originally intended. Since this will result in an extreme amount of gain, the circuit self-compensates by providing a larger amount of feedback through resistor 19 to the base 7. That is, the DC bias will correct this disparity in gain. Thus, the circuit of the present invention successfully accommodates extreme ranges of betas without the necessity of selecting a high beta to achieve the high input impedance of transistor 1. It is not important which of the two transistors has a higher beta, or whether each has approximately the same gain within reasonable limits.

Referring now to FIG. 2, there is shown a modification of the invention designed for use with silicon transistors. In FIG. 2, there is shown transistors 22 and 23 which are directly coupled from emitter to base. The input signal is applied to input terminal 24 and then to base 25 of transistor 22 via input coupling capacitor 26. The emitter 27 of transistor 22 is connected directly to base 28 of transistor 23. Positive operating potential is applied directly to the collector 29 of transistor 23 from power supply terminal 31, and to the collector 32 of transistor 22 via resistor 33. Resistor 34 comprises the emitter resistor for emitter 27 and resistor 35 is a common emitter resistor for emitter 40 and emitter 27. The output appears at terminal 37 via output coupling capacitor 36. The AC feedback and the DC bias for the first stage is provided via feedback resistor 38. The collector-to-emitter circuit of transistor 22 is shunted by capacitor 39. As can be seen, in this circuit the output apppears across resistor 35 rather than across the second stage collector resistor as in the circuit of FIG. 1. Stated another way, what would ordinarily be the emitter-follower output of the first stage is replaced by inserting the load in the collector circuit of the first stage. Thus, it is reverse of prior circuits in which the emitter-follower comprises the second stage, amplification is in the first stage, and the signal is coupled back from the base 28 of the second stage (23).

The DC gain stability control is almost exactly the same as in the first circuit. However, since the feedback resistor 38 is coupled directly to the power supply terminal 31, there is no AC feedback via resistor 38. Therefore, the AC feedback is obtained via resistors 34 and 35. Stabilization depends primarily on the fact that the voltage drop across resistors 34 and 35 changes with current change or temperature change at transistor 22.

Capacitor 39 is the AC signal path from collector 32 to the base 28 of transistor 23. As can be seen, the AC signal at the base 28 is added to the DC voltage appearing at the junction of the emitter 27 and resistor 34. The signal voltage at the base 28 cannot exceed the output signal through capacitor 36. The reason is that there is no amplification between emitter 40 and base 28. However, there is a substantial amplification between the base 28 and the collector 29 which results in additional signal even though it is out of phase. This gain offsets the amount of AC signal at the emitter 40, and appears at the base via resistor 33 for further amplification. The amplified signals are obtained through capacitor 39 from the collector load resistor 33. Stated another way, the voltage appearing across resistor 33 ultimately appears at the base 28 and provides a somewhat larger signal flowing across resistor 35, for current amplification.

While the circuit of FIG. 2 does not give as high a performance as the circuit of FIG. 1, this disparity is somewhat offset by the fact that silicon transistors are capable of operating at higher ambient temperatures, than are germanium transistors. It has been shown in a practical construction that the circuit of FIG. 2 will work well with either silicon or germanium type transistors.

By way of summary, in the circuit of FIG. 1, the AC signal paths and the DC paths are identical whereas in the circuit of FIG. 2, the AC and DC signal paths are different. There is an additional AC path through capacitor 39 to the base 28 of transistor 23. It is at this circuit point that the signal appearing at the collector 32 is transferred to the base 28 via capacitor 39. The base 28 is direct-coupled as regards DC bias, and has a DC signal path to the emitter of transistor 22. The only other significant difference is that the output appears across the emitter resistor 35 rather than at the collector as in the case of the embodiment of FIG. 1. In the circuit of FIG. 1, transistor 1 operates principally as an emitter-follower having a gain of less than 1 and the output of which is applied to the base of transistor 2. Substantially all of the gain takes place in transistor 2 and is developed across resistor 13. In the circuit of FIG. 2, however, the first stage transistor 22 is not an emitter-follower because its gain depends upon the value of resistor 33 with respect to the source impedance of emitter 27 as to whether there will be a gain of 1, 2, 3, or a gain of zero, or less than 1. The signal from emitter 27 is applied to the base 28 of transistor 23 which provides a gain of less than unity across resistor 35. This may require that resistor 34 be reduced to a much lower value in order to assure that the gain through transistor 22, appearing across resistor 35 is adequate. As can be seen, the load is divided between the emitter 40 and the collector 29.

The AC gain may be adjusted by varying the values of resistors 19 and 15 in the circuit of FIG. 1 and any adjustment in gain will not alter the temperature stability of the circuit. In either embodiment, the low frequency response is limited only by the values of corresponding ones of the coupling capacitors 8, 18, 26 and 36.

If desired, the output from the circuit of FIG. 1 may be taken from the junction between resistors 14 and 15, in which case the output impedance will be approximately half that of the value of resistor 15.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A transistorized amplifier comprising:
first and second transistors of the same conductivity type, each transistor having a base, an emitter, and a collector;
means directly connecting the emitter of said first transistor to the base of said second transistor, said means providing both an AC and a DC path from said first transistor to the base of said second transistor;
input terminal means connected to the base of said first transistor for receiving an input signal;
output terminal means for obtaining an output from said second transistor;
a load impedance having one terminus connected to the collector of said second transistor;
means connecting a source of operating potential to the collector of said first transistor and to the other terminus of said load impedance;
means for supplying a bias potential to the emitters of said first and second transistors, said bias supplying means comprising first and second emitter resistors, said first emitter resistor being connected between the emitter of said first transistor and the emitter of said second transistor, said second emitter resistor being connected between the emitter of said second transistor and the ground terminus of said source of operating potential; and
feedback network means comprising a feedback resistor connected between the base of said first transistor and the collector of said second transistor.

2. A transistorized amplifier as defined in claim 1 wherein said network means further comprises a capacitor connected in parallel with said feedback resistor.

3. A transistorized amplifier comprising:
first and second transistors of the same conductivity type, each transistor having an emitter, a base, and a collector, the emitter of said first transistor being directly connected to the base of said second transistor;
input terminal means connected to the base of said first transistor for receiving an input signal;
output terminal means connected to the emitter of said second transistor;
a load impedance having one terminus connected to the collector of said first transistor;
means connecting a source of operating potential to the collector of said second transistor and to the other terminus of said load impedance;
means comprising a capacitor having one terminus connected to the collector of said first transistor and the other terminus connected to the base of said second transistor, for providing an AC path between said first transistor and the base of said second transistor;
bias supplying means comprising first and second emitter resistors, said first emitter resistor being connected between the emitter of said first transistor and the emitter of said second transistor, said second emitter resistor being connected between the emitter of said second transistor and the ground terminus of said source of operating potential; and
feedback network means comprising a feedback resistor connected between the collector of said second transistor and the base of said first transistor.

4. A transistorized amplifier as defined in claim 1 wherein said output terminal means is connected to the collector of said second transistor.

5. A transistorized amplifier as defined in claim 1 wherein said output terminal means is connected to the emitter of said second transistor.

6. A transistorized amplifier comprising:
first and second transistors of the same conductivity type, each transistor having a base, an emitter and a collector, the emitter of said first transistor being directly connected to the base of said second transistor;
input terminal means connected to the base of said first transistor for receiving an AC input signal;
the collector of one of said transistors being connected directly to said operating potential terminus;
a load resistor directly connected between the collector of the other of said transistors and said operating potential terminus;
a single power source having an operating potential terminus and a ground terminus;
means interconnecting both of said emitters and said ground terminus consisting solely of first and second resistors, said first resistor being directly connected between said emitters, said second resistor being directly connected between said emitter of said second transistor and said ground terminus, whereby said second resistor provides emitter bias for both of said transistors in response to emitter current in either of said transistors, and said first and second resistors provide base bias for said second transistor; and
a feedback resistor directly connected between the base of said first transistor and the collector of said second transistor, said feedback resistor constituting the sole DC connection to said base of said first transistor and providing both AC feedback and DC bias thereto.

References Cited

UNITED STATES PATENTS

| | | | |
|---|---|---|---|
| 2,844,667 | 7/1958 | Yaeger | 330—19 |
| 3,207,999 | 9/1965 | Carruth et al. | 330—22 X |
| 3,260,949 | 7/1966 | Voorhoeve | 330—19 |
| 3,332,028 | 7/1967 | Kayser et al. | 330—19 |
| 3,344,283 | 9/1967 | Stubbs | 330—28 |

ROY LAKE, Primary Examiner

L. J. DAHL, Assistant Examiner

U.S. Cl. X.R.

330—22, 28